(12) United States Patent
Navid

(10) Patent No.: US 10,243,571 B2
(45) Date of Patent: *Mar. 26, 2019

(54) SOURCE-SYNCHRONOUS RECEIVER USING EDGE-DETECTION CLOCK RECOVERY

(71) Applicant: Rambus Inc., Sunnyvale, CA (US)

(72) Inventor: Reza Navid, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/690,665

(22) Filed: Aug. 30, 2017

(65) Prior Publication Data

US 2018/0083639 A1  Mar. 22, 2018

Related U.S. Application Data

(63) Continuation of application No. 15/021,874, filed as application No. PCT/US2014/055345 on Sep. 12, 2014, now Pat. No. 9,780,795.

(Continued)

(51) Int. Cl.
*H03L 7/07* (2006.01)
*H03L 7/08* (2006.01)

(Continued)

(52) U.S. Cl.
CPC ............ *H03L 7/0807* (2013.01); *H03L 7/083* (2013.01); *H03L 7/0812* (2013.01);

(Continued)

(58) Field of Classification Search
CPC ... H03L 7/0807; H03L 7/0812; H03L 7/0814; H03L 7/083; H03L 7/24; H03L 7/07; H04B 1/22; H04B 1/7085

(Continued)

(56) References Cited

U.S. PATENT DOCUMENTS 6,002,282 A 12/1999 Alfke
6,114,890 A * 9/2000 Okajima ............... H03L 7/0805
327/170

(Continued)

FOREIGN PATENT DOCUMENTS

FR  2914808 A1  10/2008

OTHER PUBLICATIONS

Notification Concerning Transmittal of International Preliminary Report on Patentability (IPRP) dated Mar. 31, 2016 re Int'l Appln. No. PCT/US14/055345. 9 Pages.

(Continued)

*Primary Examiner* — Emmanuel Bayard

(74) *Attorney, Agent, or Firm* — The Neudeck Law Firm, LLC

(57) ABSTRACT

A source-synchronous clocking signal is sampled by an edge sampler triggered by a phase-adjusted version of the clocking signal. The output of the edge sampler is used as a phase-error indicator for a filtered feedback loop that aligns the phase-adjusted clocking signal to minimize, on average, the difference between the received source-synchronous clocking signal and the phase-adjusted version of the clocking signal minus the setup time of the sampler. This forms a delay-locked loop configuration. The phase adjustment information used to produce the aligned phase-adjusted clocking signal is then to produce a receiver clocking signal that is used to sample the source-synchronous data signal.

20 Claims, 10 Drawing Sheets

Related U.S. Application Data

(60) Provisional application No. 62/004,021, filed on May 28, 2014, provisional application No. 61/952,025, filed on Mar. 12, 2014, provisional application No. 61/878,278, filed on Sep. 16, 2013.

(51) Int. Cl.
*H03L 7/081* (2006.01)
*H03L 7/083* (2006.01)
*H03L 7/24* (2006.01)
*H04B 1/22* (2006.01)
*H04B 1/7085* (2011.01)

(52) U.S. Cl.
CPC .............. *H03L 7/0814* (2013.01); *H03L 7/24* (2013.01); *H04B 1/22* (2013.01); *H04B 1/7085* (2013.01)

(58) Field of Classification Search
USPC ................ 375/215, 226, 204, 327, 371–376
See application file for complete search history.

(56) References Cited

U.S. PATENT DOCUMENTS

| | | | |
|---|---|---|---|
| 6,150,863 A | 11/2000 | Conn et al. | |
| 6,271,777 B1 | 8/2001 | Lentine et al. | |
| 6,700,414 B2 * | 3/2004 | Tsujino | H03D 13/004 327/158 |
| 7,058,150 B2 | 6/2006 | Buchwald et al. | |
| 7,471,691 B2 | 12/2008 | Black et al. | |
| 7,627,066 B2 | 12/2009 | Best et al. | |
| 7,683,729 B2 | 3/2010 | Mansuri et al. | |
| 8,331,517 B2 | 12/2012 | Lin | |
| 8,755,480 B1 | 6/2014 | Leong | |
| 9,780,795 B2 * | 10/2017 | Navid | H03L 7/0812 |
| 2004/0222828 A1 * | 11/2004 | Ishikawa | G11C 7/1051 327/156 |
| 2005/0105349 A1 | 5/2005 | Dahlberg et al. | |
| 2009/0179674 A1 | 7/2009 | Tamura et al. | |
| 2009/0322389 A1 | 12/2009 | Singh et al. | |
| 2011/0182390 A1 | 7/2011 | Lin et al. | |
| 2012/0063524 A1 | 3/2012 | Stott et al. | |
| 2012/0155567 A1 * | 6/2012 | Kim | G06F 1/04 375/295 |
| 2013/0243107 A1 | 9/2013 | Chmelar et al. | |

OTHER PUBLICATIONS

PCT International Search Report and Written Opinion dated Nov. 21, 2014 in International Application No. PCT/US2014/055345. 88 pages.

* cited by examiner

SOURCE-SYNCHRONOUS RECEIVER USING EDGE-DETECTION CLOCK RECOVERY

CROSS-REFERENCE TO RELATED APPLICATIONS

The present application in a continuation of U.S. patent application Ser. No. 15/021,874, filed Mar. 14, 2016, which is a 371 of international application PCT/US2014/055345, filed Sep. 12, 2014, which claims the benefit of U.S. Provisional Application Ser. No. 61/878,278, filed Sep. 16, 2013, and titled SOURCE SYNCHRONOUS RECEIVER, and claims the benefit of U.S. Provisional Application Ser. No. 61/952,025, filed Mar. 12, 2014, and titled SOURCE-SYNCHRONOUS RECEIVER USING EDGE-DETECTION CLOCK RECOVERY, and claims the benefit of U.S. Provisional Application Ser. No. 62/004,021, filed May 28, 2014, and titled SOURCE-SYNCHRONOUS RECEIVER USING EDGE-DETECTION CLOCK RECOVERY, all of which are hereby incorporated herein by reference for all purposes.

DETAILED DESCRIPTION OF THE EMBODIMENTS

In an embodiment, an integrated circuit receives a clocking signal (a.k.a., timing reference signal) and corresponding source-synchronous data signal. The source-synchronous clocking signal is sampled by an edge sampler triggered by a phase-adjusted version of the clocking signal. The output of the edge sampler is used as a phase-error indicator. The phase indicator is part of a filtered feedback loop that aligns the phase-adjusted clocking signal to phase-lock the received source-synchronous clocking signal and the phase-adjusted version of the clocking signal. This forms a delay-locked loop configuration. The phase adjustment information used to produce the aligned phase-adjusted clocking signal is used to produce a receiver clocking signal. The receiver clocking signal is used to sample the source-synchronous data signal with maximum timing margin.

By applying the received clocking signal to the delay-locked loop configuration, much of the jitter on the clocking signal is filtered out. By using an edge sampler that matches the data sampler as a phase-detector, the jitter of the clock sampler will tend to track the jitter of the data sampler.

Figure 1:
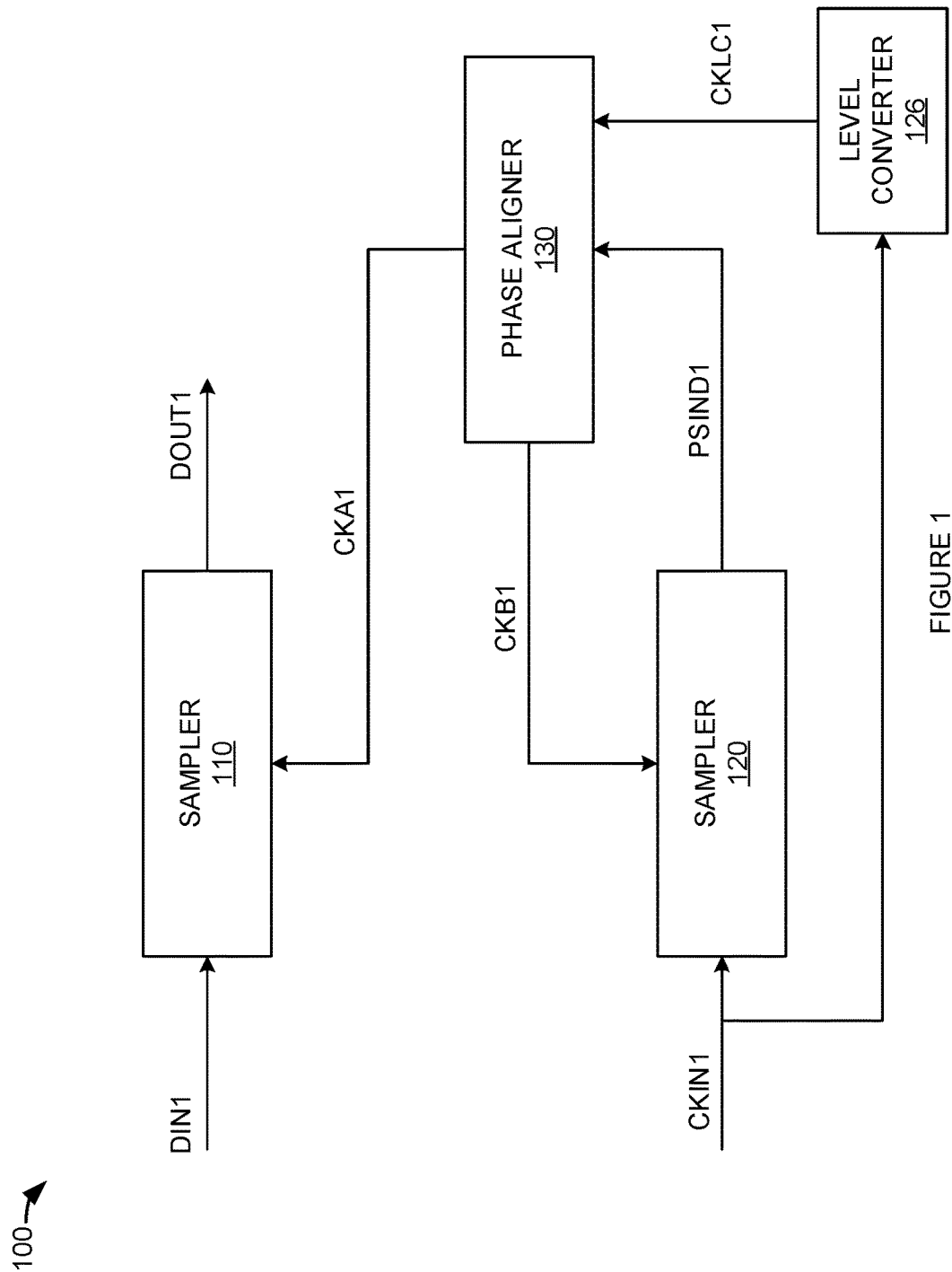
FIG. 1 is a block diagram illustrating a source-synchronous receiver.

FIG. 1 is a block diagram illustrating a source-synchronous receiver. In FIG. 1, receiver 100 comprises sampler 110, sampler 120, level converter 126, and phase aligner 130. Receiver 100 receives a source-synchronously timed data signal (DIN1), and a timing reference signal (CKIN1). DIN1 is received by sampler 110. CKIN1 is received by sampler 120 and level converter 126. The output of level converter 126 (CKLC1) is received by phase aligner 130. Phase aligner 130 produces a first clock signal (CKA1) and a second clock signal (CKB1). CKA1 is supplied to sampler 110 as the timing reference signal that causes sampler 110 to sample DIN1. CKB1 is supplied to sampler 120 as the timing reference signal that causes sampler 120 to sample CKIN1. The output of sampler 110 is the resolved value (DOUT) of DIN1 as sampled by sampler 110 according to the timing of timing reference CKA1. The output of sampler 120 is the resolved value (PSIND1) of CKIN1 as sampled by sampler 120 according to the timing of timing reference CKB1. PSIND1 provides an indicator of, for each sampling of CKIN1, the phase difference between CKB1 and CKIN1.

PSIND1 and CKLC1 are received by phase aligner 130. Based on PSIND1, phase aligner 130 adjusts the timing of CKB1 to align the transitions of CKB1 with the transitions of CKIN1. In other words, phase aligner 130 adjusts the phase of CKB1 (which is derived from the level converted CKIN1 signal—CKLC1) in order to minimize the phase difference between CKB1 and CKIN1 minus the setup time of the sampler 120. The phase difference between CKB1 and CKIN1 is indicated by PSIND1. Thus, phase aligner 130 adjusts the phase of CKB1 according to PSIND1 such that the phase difference between CKIN1 and CKB1 minus the setup time of sampler 120, as indicated by PSIND1, is minimized.

Phase aligner 130 also produces CKA1. CKA1 is supplied to sampler 110 as the timing reference signal that causes DIN1 to be sampled by sampler 110. CKA1 may be a phase adjusted version of CKIN1 and/or CKB1. For example, in a double-data-rate systems (i.e., where the frequency of clock CKIN1 is one-half the data rate on DIN1), CKA1 may be derived from CKIN1 such that CKA1 is ¼ of a cycle out of phase with CKB1 (and thereby CKIN1 minus the setup time of the sampler 110, when the phase difference between CKIN1 and CKB1 minus the setup time of the sampler 110 is minimized).

It should be understood that the feedback loop formed by sampler 120, PSIND1, phase aligner 130, and CKB1, functions to filter out jitter in the reception of CKIN1 by level converter 126. Also, when sampler 110 and sampler 120 are matched (e.g., sampler 110 and sampler 120 have the same design and are supplied by the same power supplies) the jitter of sampler 120 will be correlated with the jitter of sampler 110. This helps make the timing of the sampling of DIN1 according to the timing of CKA1 more accurate. In addition, sampler 120 may be selected and designed to be more immune to signal and/or power supply noise than level converter 126. Additional elements, such as clock and/or data buffers (i.e., buffers in the signal path of CKIN1 and/or DIN1) may be included in the feedback loop. By including these buffers in the feedback loop, the loop will function to help filter out jitter introduced by these buffers. It should also be understood that the feedback loop may be activated (i.e., actively adjusting the timing of CKB1 to minimize the phase difference with CKIN1 minus the setup time of sampler 120) intermittently as opposed to being activated continuously. A periodic or occasional calibration of CKB1 and CKA1 may be performed while the loop is activated and the loop disabled the rest of the time. These calibrations may be even performed at times when DIN1 is carrying valid information. When these calibrations are performed when DIN1 is valid, they may be performed without interrupting the data traffic carried by DIN1.

Figure 2:
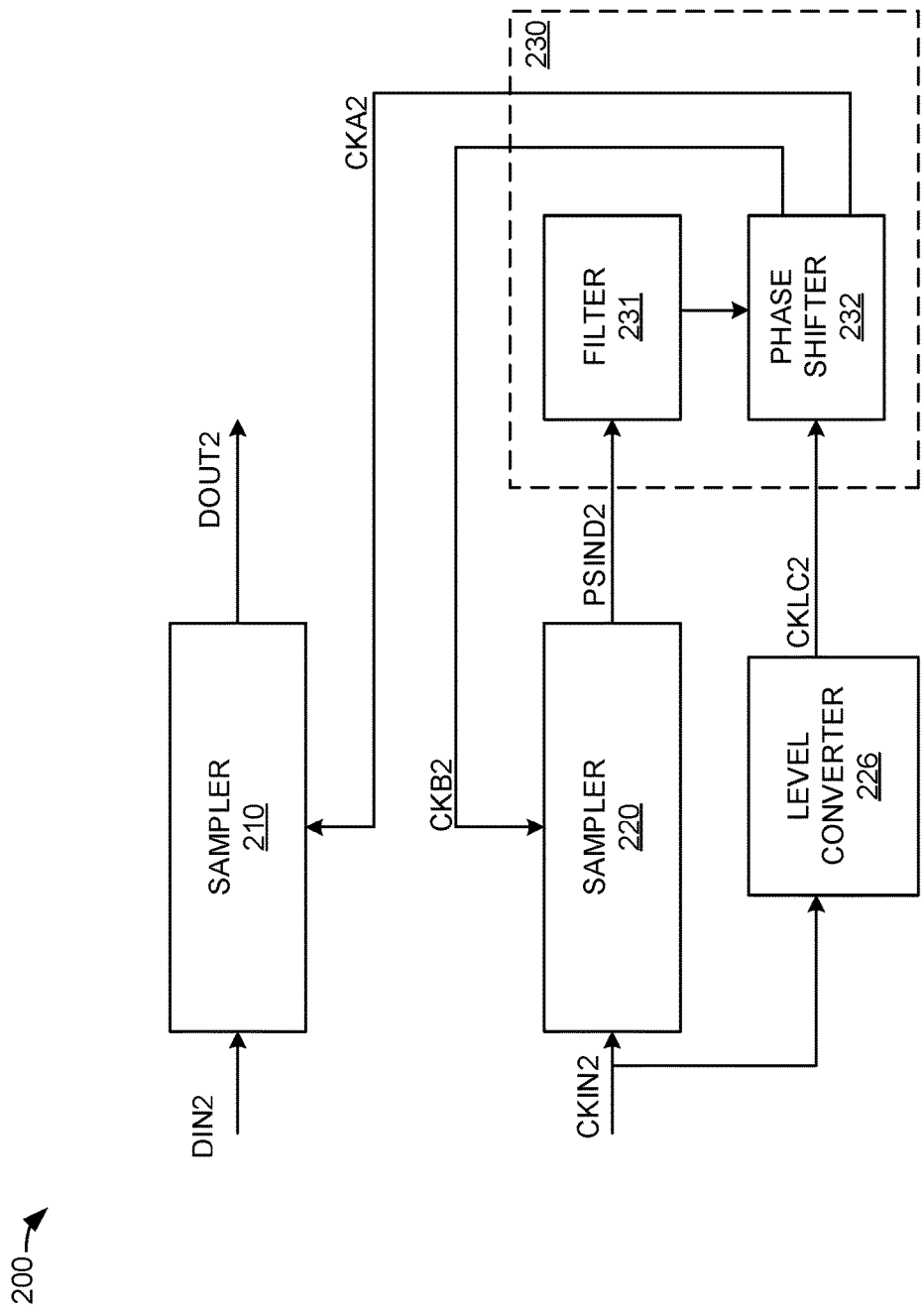
FIG. 2 is a block diagram illustrating an embodiment of a source-synchronous receiver.

FIG. 2 is a block diagram illustrating an embodiment of a source-synchronous receiver. In FIG. 2, receiver 200 comprises sampler 210, sampler 220, level converter 226, and phase aligner 230. Phase aligner 230 includes filter 231 and phase shifter 232. It should be understood that when receiver 200 is phase-locked, sampler 210 samples data in the middle of the data eye and not at the edge. Accordingly, sampler 210 may be referred to as a "data sampler."

Receiver 200 receives a source-synchronously timed data signal (DIN2), and a timing reference signal (CKIN2). DIN2 is received by sampler 210. CKIN2 is received by sampler 220 and level converter 226. The output of level converter 226 (CKLC2) is received by phase shifter 232. Phase shifter 232 produces a first clock signal (CKA2) and a second clock signal (CKB2). CKA2 is supplied to sampler 210 as the timing reference signal that causes DIN2 to be sampled by sampler 210. CKB2 is supplied to sampler 220 as the timing reference signal that causes CKIN2 to be sampled by sampler 220. The output of sampler 210 is the resolved value (DOUT2) of DIN2 as sampled by sampler 210 according to the timing of at least one transition of timing reference CKA2. The output of sampler 220 is the resolved value (PSIND2) of CKIN2 as sampled by sampler 220 according to the timing of at least one transition of timing reference CKB2. PSIND2 provides an indicator of, for each sampling of CKIN2, the phase difference between CKB2 and CKIN2.

PSIND2 is received by filter 231 of phase aligner 230. Filter 231 is operatively coupled to phase shifter 232 to control the amount of phase shift between CKLC2 and CKA2, and also between CKLC2 and CKB2. Based on PSIND2, filter 231 acts to adjusts the timing of CKLC2 to align the transitions of CKB2 with the transitions of CKIN2 as sampled by sampler 220. In other words, phase aligner 230 adjusts the phase of CKB2 (which is derived from the level converted CKIN2 signal—CKLC2) in order to minimize, over a period of time, the phase difference between CKB2 and CKIN2 minus the setup time of the sampler 220 as measured by the samples of CKIN2 by sampler 220. The phase difference between CKB2 and CKIN2 is indicated by PSIND2. The phase difference indicated by PSIND2 is filtered (or averaged) by filter 231. The output of filter 231 adjusts the timing of CKB2 in order to minimize the phase difference indicated by PSIND2. Thus, phase aligner 230, as a whole, adjusts the phase of CKB2 according to PSIND2 such that the phase difference (minus the setup time of sampler 220) indicated by PSIND2 is minimized. Since the setup time of sampler 210 and sampler 220 are nominally the same (because sampler 210 and sampler 220 are matched circuits experiencing similar operating conditions), the loop that adjusts the phase of CKB2 according to PSIND2 also adjusts the phase of CKA2 to a desirable point for sampler 210 (as further described herein.)

Phase shifter 232 also produces CKA2. CKA2 is supplied to data sampler 210 as the timing reference signal that causes DIN2 to be sampled by sampler 210. CKA2 may be a phase adjusted version of CKIN2 and/or CKB2. For example, in a double-data-rate system systems (i.e., where the frequency of clock CKIN2 is one-half the data rate on DIN2) phase shifter 232 may derive CKA2 from CKIN2 such that CKA2 is ¼ of a cycle out of phase with CKIN2 (and thereby also approximately ¼ cycle out of phase with CKB2 when the phase difference between CKIN2 and CKB2 minus the setup time of the sampler 220 is minimized).

It should be understood that the feedback loop formed by sampler 220, PSIND2, filter 231, phase shifter 232, and CKB2 functions to filter out jitter in the reception of CKIN2 by level converter 226. Filter 231 acts to "average" PSIND2 thereby removing certain error and/or jitter causing components in the reception of CKIN2 by level converter 226 (which error and/or jitter causing components appear on CKLC2). When edge sampler 210 and sampler 220 are matched, the jitter experience by sampler 220 as it resolves CKIN2 will be correlated with the jitter experienced by sampler 210 as it resolves DIN2 to produce DOUT2. This helps make the timing of the sampling of DIN2 according to the edges of CKA2 more accurate.

Figure 3:
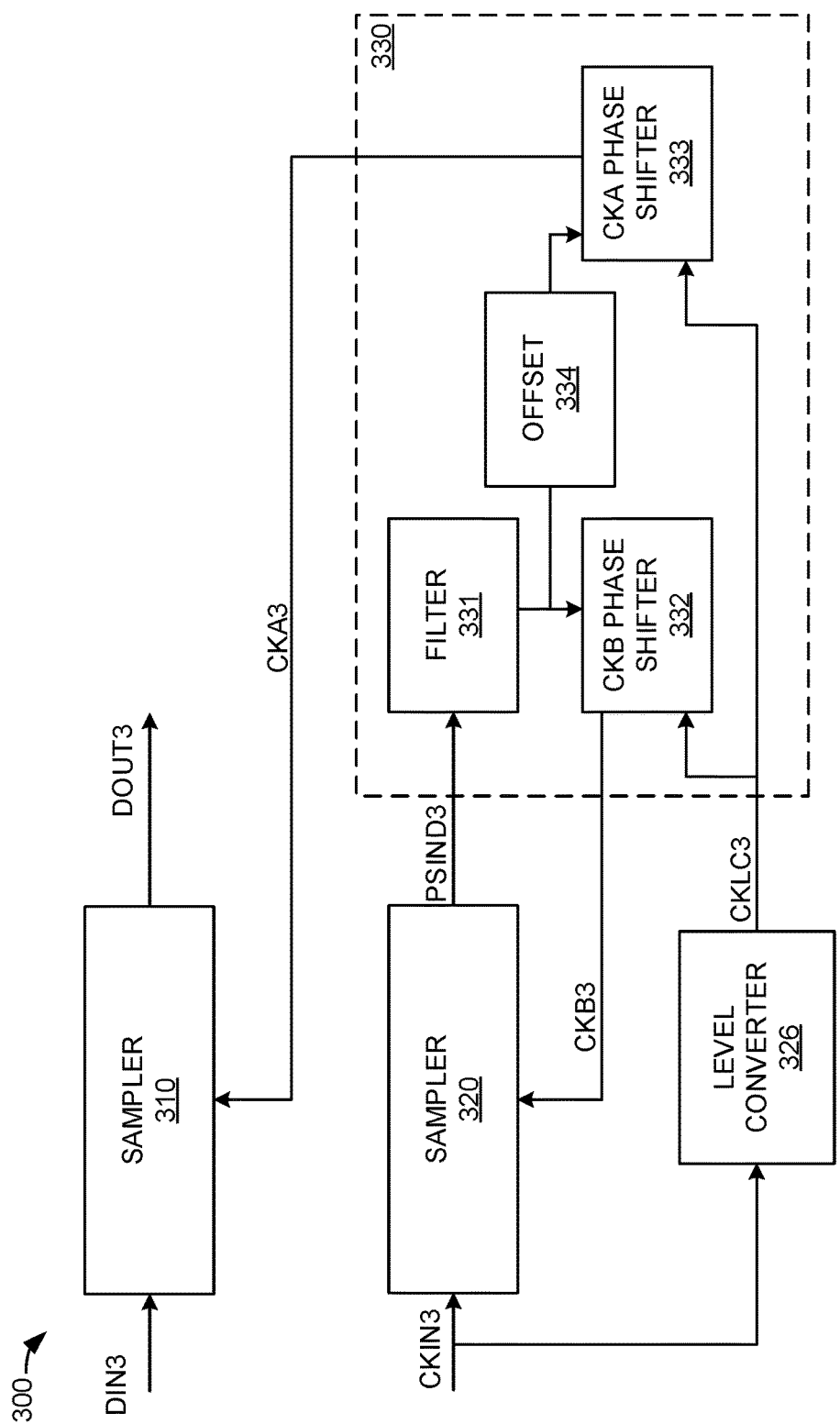
FIG. 3 is a block diagram illustrating an embodiment of a source-synchronous receiver with phase shifters.

FIG. 3 is a block diagram illustrating an embodiment of a source-synchronous receiver with phase shifters. In FIG. 3, receiver 300 comprises sampler 310, sampler 320, level converter 326, and phase aligner 330. Phase aligner 330 includes filter 331, CKB phase shifter 332, CKA phase shifter 333, and offset 334. Receiver 300 receives a source-synchronously timed data signal (DIN3), and a timing reference signal (CKIN3). DIN3 is received by sampler 310. CKIN3 is received by sampler 320 and level converter 326. The output of level converter 326 (CKLC3) is received by CKA phase shifter 333 and CKB phase shifter 332. CKA phase shifter 333 produces a first clock signal (CKA3) that is based on, and phase adjusted from, CKLC3. CKB phase shifter 332 produces a second clock signal (CKB3) that is based on, and phase adjusted from, CKLC3. The relative phase difference between CKA3 and CKB3 is determined by offset 334. Since CKLC3 is based on a level converted CKIN3 (with noise and/or jitter introduced by level converter 326), it should be understood that CKA3 and CKB3 are based on, and phase adjusted from, CKIN3—but have noise and/or jitter introduced by level converter 326 filtered out of CKLC3 by the action of a feedback loop comprising sampler 320, filter 331, and CKB phase shifter 332.

CKA3 is supplied to sampler 310 as the timing reference signal that causes DIN3 to be sampled by sampler 310. CKB3 is supplied to sampler 320 as the timing reference signal that causes sampler 320 to sample CKIN3. The output of sampler 310 is the resolved value (DOUT3) of DIN3 as sampled by sampler 310 according to the timing specified by at least one transition of timing reference CKA3. The output of sampler 320 is the resolved value (PSIND3) of CKIN3 as sampled by sampler 320 according to the timing specified by at least one transition of timing reference CKB3. PSIND3 provides an indicator of, for each sampling of CKIN3, the phase relationship between CKB3 and CKIN3. It should be understood that the setup time of sampler 320 is built into the phase comparison made by sampler 320. However, since sampler 310 and sampler 320 are the same, and should experience similar (if not the same) operating conditions, they will typically have the same setup time. Thus, DIN3 is still sampled at an optimum point in time (without further compensating for the setup time of sampler 310 and/or sampler 320—because these two setup times cancel each other out).

PSIND3 is received by filter 331 of phase aligner 330. Filter 331 is operatively coupled to control the amount of phase shift between CKLC3 and CKB3. Filter 331 is also operatively coupled, via offset 334, to control the amount of phase shift between CKLC3 and CKA3. The relative phase of CKA3 and CKB3 is determined by offset 334. In other words, if a particular value is output by filter 331, it causes CKB phase shifter 332 to produce a first particular phase difference between CKLC3 and CKB3. That same particular value output by filter 331, after being modified (e.g., increased or decreased by an amount that corresponds to ¼ of a CKIN3 cycle) by offset 334, causes CKA phase shifter 333 to produce a second particular phase difference between CKLC3 and CKA3. Therefore, the particular modification applied by offset 334 to the output of filter 331 determines the phase difference between CKA3 and CKB3.

Based on PSIND3, filter 331 acts to adjust the timing of CKB3 to align the transitions of CKB3 with the transitions of CKIN3 minus the setup time of the sampler 320 as measured by sampler 320. In other words, phase aligner 330 adjusts the phase of CKB3 in order to minimize, over a period of time, the phase difference between CKB3 and CKIN3 (minus the setup time of the sampler 320.) The phase difference between CKB3 and CKLC3 is indicated by PSIND3 which is filtered (or averaged) by filter 331. The output of filter 331 provides a control signal to CKB phase shifter 332 that causes CKB phase shifter 332 to adjust the timing of CKB3 in order to minimize the phase difference indicated by PSIND3. Thus, phase aligner 330, as a whole, adjusts the phase of CKB3 according to PSIND3 such that the phase difference indicated by PSIND3 is on average minimized. In an embodiment, PSIND3 can be a 1-bit number that takes values equivalent to +1 and −1. The feedback loop formed by sampler 320, filter 331, and CKB phase shifter 332 functions to attempt to equalize the number of +1's and −1's over a period of time.

CKA phase shifter 333 produces CKA3. CKA3 is supplied to sampler 310 as the timing reference signal that causes DIN3 to be sampled by sampler 310. CKA3 is a phase adjusted version of CKLC3. The amount of phase shift provided by CKA phase shifter is derived from the output of filter 331 as modified by offset 334. For example, offset 334 may change the output of filter 331 such that CKA phase shifter 232 phase shifts CKA3 to ¼ of a cycle minus the setup time of the sampler 320 out of phase with CKLC3 (and thereby approximately ¼ cycle out of phase with CKB3 when the phase difference between CKLC3 and CKB3 minus the setup time of the sampler 320 is minimized).

It should be understood that the feedback loop formed by sampler 320, PSIND3, filter 331, CKB phase shifter 332, and CKB3 functions to improve timing margin in resolving DIN3 to produce DOUT3. The feedback loop forces CKB3 and CKA3 to follow certain error and/or jitter causing components from level converter 326, sampler 310, and/or sampler 320. When sampler 310 and sampler 320 are matched, the jitter experienced by sampler 310 as it resolves DIN3 to produce DOUT3 will be correlated with the jitter experienced by sampler 320 as it resolves CKIN3. This results in improved timing margin in resolving DIN3 to produce DOUT3.

Figure 4:
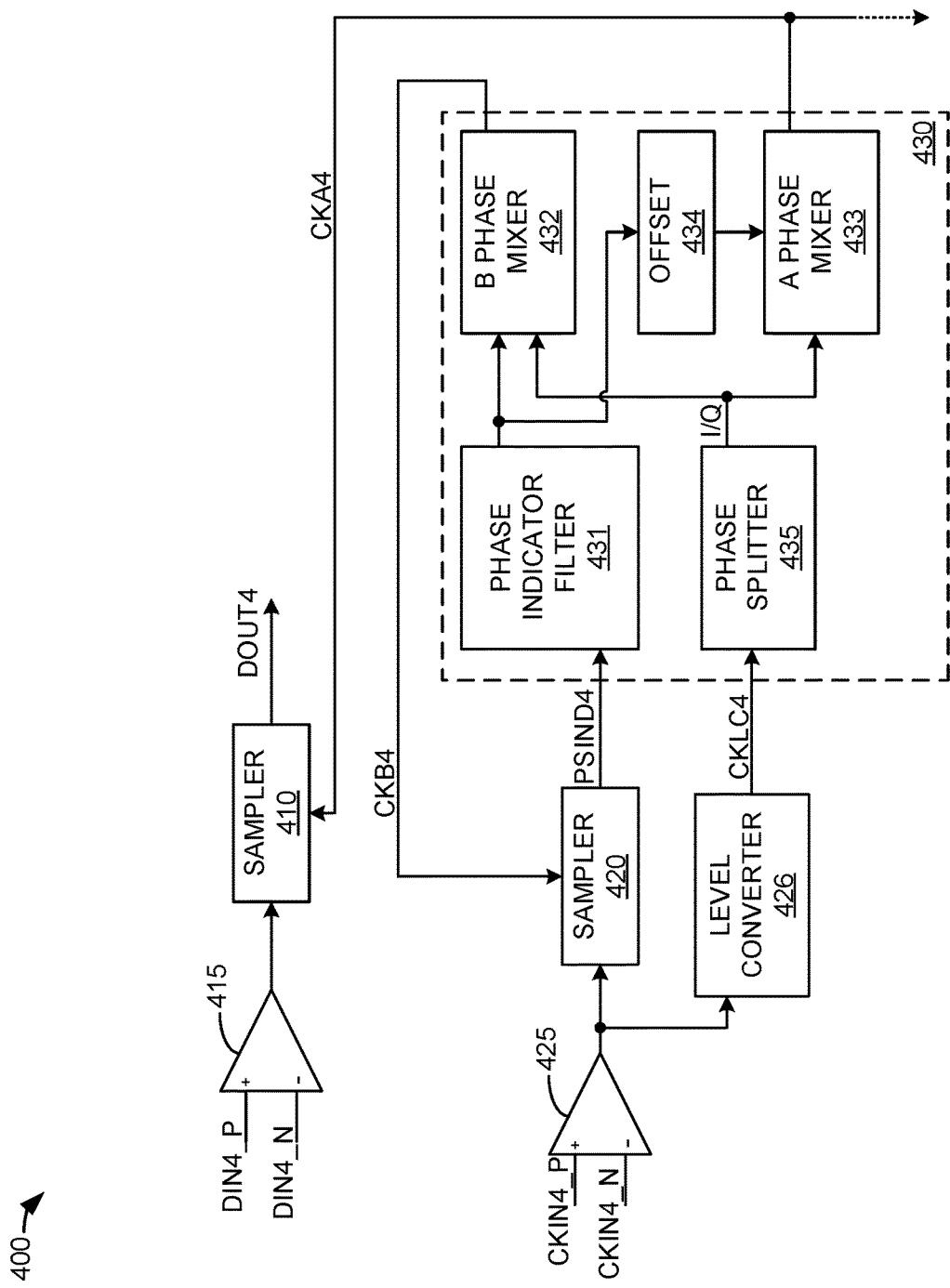
FIG. 4 is a block diagram illustrating an embodiment of a source-synchronous receiver with phase mixers and a level converter.

FIG. 4 is a block diagram illustrating an embodiment of a source-synchronous receiver with phase mixers and a level converter. In FIG. 4, receiver 400 comprises sampler 410, sampler 420, amplifier 415, amplifier 425, level converter 426, and phase aligner 430. Phase aligner 430 includes phase indicator filter 431, phase splitter 435, B phase mixer 432, A phase mixer 433, and offset 434. Receiver 400 receives a differentially signaled source-synchronously timed data signal (DIN4_P and DIN4_N—collectively DIN4), and a differentially signaled timing reference (CKIN4_P and CKIN4_N—collectively CKIN4) which is edge-to-edge-aligned with respect to DIN4. After being amplified by amplifier 415, DIN4 is received by sampler 410. After being amplified by amplifier 425, CKIN4 is received by sampler 420 and level converter 426. In an embodiment, amplifier 415 and amplifier 425 are matched to each other so that the delay and/or jitter introduced by amplifier 415 and amplifier 325 are correlated.

The output of level converter 426 (CKLC4) is operatively coupled to the input of phase splitter 435. Phase splitter 435 produces in-phase and quadrature (I/Q) signals from CKLC4. The I/Q signals (a.k.a., I/Q CK signals—since these are quadrature signals that have been derived from CKIN4 via level converter 426) output by phase splitter 435 are supplied to B phase mixer 432 and A phase mixer 433. The output of B phase mixer 432 is CKB4. The output of A phase mixer 433 is CKA4. The relative phase difference between CKA4 and CKB4 is determined by offset 434.

CKA4 is supplied to sampler 410 as the timing reference signal that causes the amplified (by amplifier 415) DIN4 signal to be sampled by sampler 410. CKB4 is supplied to sampler 420 as the timing reference signal that causes the amplified (by amplifier 425) CKIN4 signal to be sampled by sampler 420. The output of sampler 410 is the resolved value (DOUT4) of DIN4 as sampled by sampler 410 according to the timing of at least one transition of timing reference CKA4. The output of edge sampler 420 is the resolved value (PSIND4) of CKIN4 as sampled by sampler 420 according to the timing of at least one transition of timing reference CKB4. PSIND4 provides an indicator of, for each sampling of CKIN4, the phase difference between CKB4 and CKIN4 minus the setup time of the sampler 420.

PSIND4 is received by phase indicator filter 431 of phase aligner 430. Phase indicator filter 431 is operatively coupled to B phase mixer 432 in order to control the phase shift between the I/Q signals input to B phase mixer 432 and the output of B phase mixer 432, CKB4. Phase indicator filter 431 is also operatively coupled, via offset 434, to A phase mixer 433 in order to control the phase shift between the I/Q signals input to A phase mixer 433 and the output of A phase mixer 433, CKA4. The relative phase of CKA4 and CKB4 is determined by offset 434.

In an embodiment, B phase mixer 432 and A phase mixer 433 are controlled by digital values. Thus, offset 434 may control the relative phase of CKA4 and CKB4 by adding (or subtracting) a predetermined amount from the digital value received by offset 434 to produce the value used to control A phase mixer 433.

In an embodiment, the control values output by phase indicator filter 431, after being modified (e.g., increased or decreased) by offset 434, causes A phase mixer 433 to produce a phase difference between CKA4 and CKB4 that approximates (or is equal to) ¼ of a cycle.

Based on PSIND4, phase indicator filter 431 acts a control input of B phase mixer 432 to adjust the timing of CKB4 to align the transitions of CKB4 with the transitions of CKIN4 minus the setup time of sampler 420. In other words, phase aligner 430 adjusts the phase of CKB4 in order to minimize, over a period of time, the phase difference between CKB4 and CKIN4 minus the setup time of sampler 420. The phase difference between CKB4 and CKIN4, is indicated by PSIND4 which is filtered (or averaged) by phase indicator filter 431. The output of phase indicator filter 431 controls B phase mixer 432 such that B phase mixer 432 adjusts the timing of CKB4 to minimize the phase difference indicated by the average of PSIND4 over a period of time. Thus, phase aligner 430, as a whole, adjusts the phase of CKB4 according to PSIND4 such that the phase difference indicated by the average of PSIND4 over a period of time is minimized. In an embodiment, PSIND4 is a one bit digital number representing a +1 or −1. The feedback loop operates such that, over a period of time, the average of the +1 and −1's represented by PSIND4 approaches (or equals) zero.

A phase mixer 433 produces CKA4. CKA4 is supplied to sampler 410 (and/or other data input samplers—not shown in FIG. 4) as the timing reference signal that causes the amplified DIN4 signal to be sampled by sampler 410. Since A phase mixer 433 produces CKA4 based on a received version of CKIN4 (i.e., the I/Q CK signals received via level shifter 426 and phase splitter 435), CKA4 is a phase adjusted version of CKIN4. The amount of phase delay provided by A phase mixer 433 is derived from the output of phase indicator filter 431 as modified by offset 434. For example, offset 434 may add or subtract a constant value (or signal amount) from the output of phase indicator filter 434 such that A phase mixer 433 phase shifts the I/Q CK signals to ¼ of a cycle out of phase with CKA4 (because both B phase mixer 432 and A phase mixer 433 receive the I/Q CK signals as inputs to be phase shifted/delayed).

In an embodiment, offset 434 may add or subtract a predetermined value (or signal amount) obtained from a lookup table. This lookup table can take the output of phase indicator filter 434 as an input. This allows the predetermined value (or signal amount) to be variable in order to compensate for nonlinearities of A phase mixer 433 and/or B phase mixer 432. Thus, a lookup table can be used to change an offset value depending on the value of the code input to B phase mixer 432. The lookup table can be populated during startup sequence.

It should be understood that the feedback loop formed by sampler 420, PSIND4, phase indicator filter 431, B phase mixer 432, and CKB4 functions to help filter out jitter in the reception of CKIN4 by level converter 426. The loop forces CKB4 to follow CKIN4, within its bandwidth, thereby removing certain error and/or jitter causing components from the timing of CKLC4.

Figure 5:
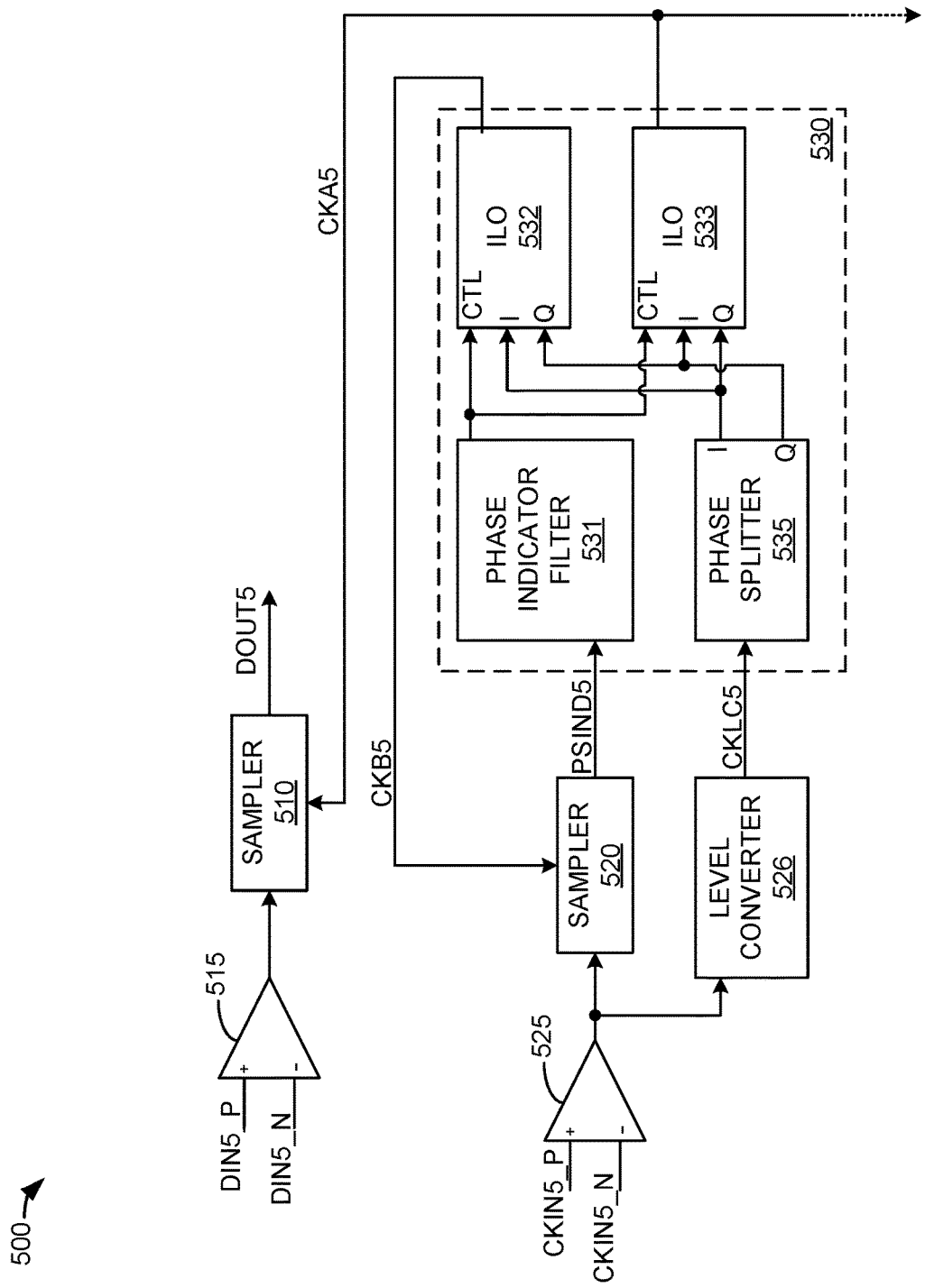
FIG. 5 is a block diagram illustrating an embodiment of a source-synchronous receiver using injection locked oscillators.

FIG. 5 is a block diagram illustrating an embodiment of a source-synchronous receiver using injection locked oscillators. In FIG. 5, receiver 500 comprises sampler 510, sampler 520, amplifier 515, amplifier 525, level converter 526, and phase aligner 530. Phase aligner 530 includes phase indicator filter 531, phase splitter 535, injection locked oscillator (ILO) 532, and injection locked oscillator 533. Receiver 500 receives a differentially signaled source-synchronously timed data signal (DIN5_P and DIN5_N—collectively DIN5), and a differentially signaled timing reference (CKIN5_P and CKIN5_N—collectively CKIN5). After being amplified by amplifier 515, DIN5 is received by sampler 510. After being amplified by amplifier 525, CKIN5 is received by sampler 520 and level converter 526. In an embodiment, amplifier 515 and amplifier 525 are matched to each other so that the delay and/or jitter introduced by amplifier 415 and amplifier 325 are correlated.

The output of level converter 526 is operatively coupled to the input of phase splitter 535. Phase splitter 535 produces in-phase and quadrature (I/Q) signals from the level converted (by level converter 526) CKIN5 signal. The I/Q signals (a.k.a., I/Q CK signals—since these are quadrature signals that have been derived from CKIN5) output by phase splitter 535 are supplied to injection locked oscillator 532 and injection locked oscillator 533.

The in-phase output (i.e., I output) of phase splitter 535 is supplied to the in-phase signal input (i.e., I signal input) of injection locked oscillator 532. The quadrature output (i.e., Q output) of phase splitter 535 is supplied to the quadrature signal input (i.e., Q signal input) of injection locked oscillator 532. The in-phase output (i.e., I output) of phase splitter 535 is also supplied to the quadrature signal input (i.e., Q signal input) of injection locked oscillator 533. The quadrature output (i.e., Q output) of phase splitter 535 is also supplied to the in-phase signal input (i.e., I signal input) of injection locked oscillator 533. Because the I/Q signal outputs of phase splitter 535 are swapped when input to injection locked oscillators 532 and 533, the outputs that injection locked oscillators 532 and 533 produce are 90° out of phase with each other. The output of injection locked oscillator 532 is CKB5. The output of injection locked oscillator 533 is CKA5. Thus, the relative phase difference between CKA5 and CKB5 is 90°.

CKA5 is supplied to sampler 510 as the timing reference signal that causes the amplified (by amplifier 515) DIN5 signal to be sampled by sampler 510. CKB5 is supplied to sampler 520 as the timing reference signal that causes the amplified (by amplifier 525) CKIN5 signal to be sampled by sampler 520. The output of sampler 510 is the resolved value (DOUT5) of DIN5 as sampled by sampler 510 according to the timing of at least one transition of timing reference CKA5. The output of sampler 520 is the resolved value (PSIND5) of CKIN5 as sampled by sampler 520 according to the timing of at least one transition of timing reference CKB5. PSIND5 provides an indicator of, for each sampling of CKIN5, the phase difference between CKB5 and CKIN5.

PSIND5 is received by phase indicator filter 531 of phase aligner 530. Phase indicator filter 531 is operatively coupled via a digital value, analog control signal, analog current, or analog voltage (CTL) to injection locked oscillator 532 in order to control the phase shift between the I/Q signals input to injection locked oscillator 532 and the output of injection locked oscillator 532, CKB5. Phase indicator filter 531 is also operatively coupled via a digital value, analog control signal, analog current, or analog voltage (CTL) to injection locked oscillator 533 in order to control the phase shift between the I/Q signals input to injection locked oscillator 533 and the output of injection locked oscillator 533, CKA5. The relative phase of CKA5 and CKB5 is, as discussed previously, determined by the reversed connection of the I/Q signals input to injection locked oscillator 532 when compared to the connection of the I/Q signals input to injection locked oscillator 533. In an embodiment, ILO 532 can receive an inverse of I in place of I and an inverse of Q in place of Q. This results in the same general function.

Based on PSIND5, phase indicator filter 531 controls injection locked oscillator 532 to adjust the timing of CKB5 to align the transitions of CKB5 with the transitions of CKIN5 minus the setup time of sampler 520. In other words, phase aligner 530 adjusts the phase of CKB5 in order to minimize, over a period of time, the phase difference between CKB5 and CKIN5 minus the setup time of sampler 420. The phase difference between CKB5 and CKIN5, is indicated by PSIND5 which is filtered (or averaged) by phase indicator filter 431 to produce the output of phase indicator filter 531—CTL. CTL controls injection locked oscillator 532 such that injection locked oscillator 532 adjusts the timing of CKB5 to minimize the phase difference indicated by PSIND5. Thus, phase aligner 530, as a whole, adjusts the phase of CKB5 according to PSIND5 such that the phase difference indicated by PSIND5, on average and over a period of time, is minimized.

Injection locked oscillator 533 produces CKA5. CKA5 is supplied to sampler 510 (and/or other data input samplers—not shown in FIG. 5) as the timing reference signal that causes the amplified DIN5 signal to be sampled by sampler 510. Since injection locked oscillator 533 produces CKA5 based on a received version of CKIN5 (i.e., the I/Q CK signals received via level shifter 526 and phase splitter 535), CKA5 is a phase adjusted version of CKIN5.

It should be understood that the feedback loop formed by sampler 520, PSIND5, phase indicator filter 531, injection locked oscillator 532, and CKB5 functions to help filter out jitter in the reception of CKIN5 by level converter 526. The loop forces CKB5 to follow CKIN5, within its bandwidth, thereby removing certain error and/or jitter causing components from the timing of the clock output (CKLC5) of the level converter.

Figure 6:
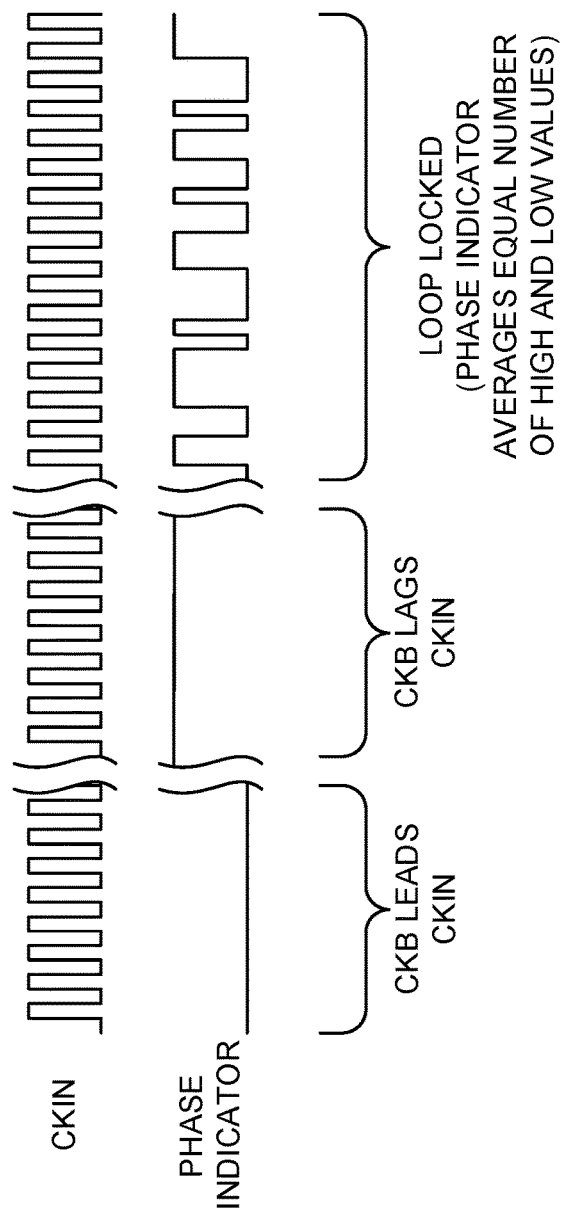
FIG. 6 is an example timing diagram illustrating phase-locked and phase-unlocked conditions.

FIG. 6 is an example timing diagram illustrating phase-locked and phase-unlocked conditions. In FIG. 6, an input clock (CKIN) and a phase indicator (PSIND) are illustrated. CKIN and PSIND can correspond, for example, to CKIN4 and PSIND4 (in which case, CKB would correspond to CKB4). During a first time period illustrated in FIG. 6, CKB leads CKIN (e.g., the edges of CKB4 arrive at, for example, sampler 420 earlier in time than the edges of CKIN4 minus the setup time of the sampler). During this first time period, the phase indicator (e.g., PSIND4) is shown consistently having a low value. During a second time period, CKB lags CKIN (i.e., the edges of CKB4 arrive later in time than the edges of CKIN4 minus the setup time of the sampler). During this second time period, the phase indicator is shown consistently having a high value. During a third time period, the feedback loop is locked and the phase indicator is shown switching between the low and high values in an arbitrary, or random, pattern where the proportion of low and high values are, on average, equal. In this condition, on average, the phase difference between CKB and CKIN minus the setup time of the sampler as indicated by the phase indicator is not biased or skewed to either a CKB leading CKIN condition, or a CKB lagging CKIN condition—thereby minimizing the phase difference indicated by the phase indicator.

Figure 7:
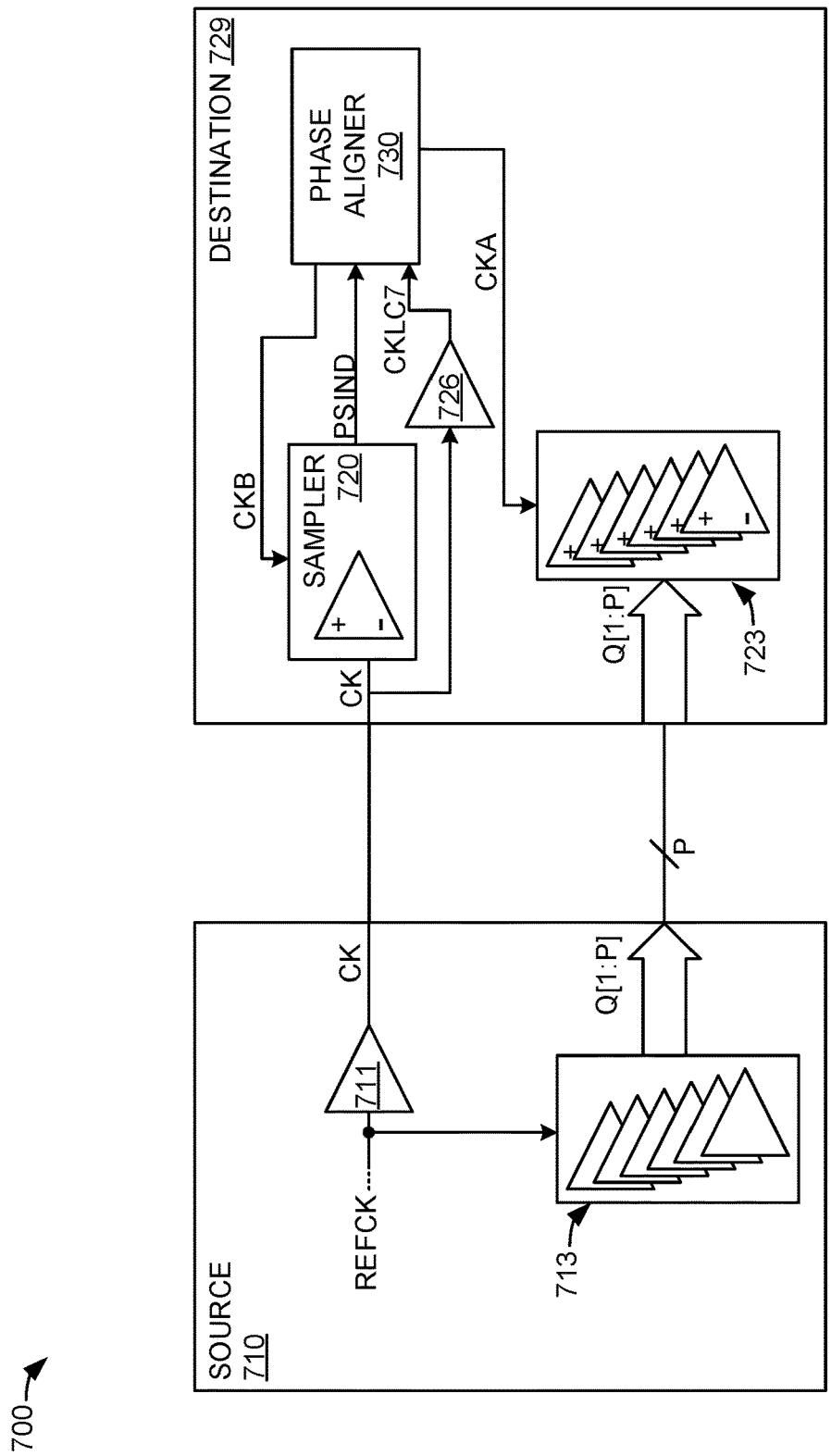
FIG. 7 is a block diagram illustrating a communication system.

FIG. 7 is a block diagram illustrating a communication system. Communication system 700 comprises source device 710 and destination device 729. Source device 710 includes driver 711, and drivers 713. Source device 710 also includes source-synchronous timing reference port CK that is driven by driver 711. Driver 711 is illustrated receiving an internal timing reference signal REFCK. Source device 710 also includes P number of signal ports Q[1:P] that are driven by drivers 713. Drivers 713 are also illustrated receiving internal timing reference signal REFCK. Source device 710 may also include receivers (not shown in FIG. 7) for receiving signals from destination device 729 either via the Q[1:P] signal ports or via separate ports. Destination 729 includes sampler 720, receivers 723, level converter 726, and phase aligner 730. Sampler 720 is operatively coupled to phase aligner 730 by phase indicator PSIND. Level converter 726 receives CK and produces CKLC7. Sampler 720 receives timing reference CKB from phase aligner 730. Phase aligner 730 is operatively coupled to receivers 723 by timing reference CKA.

Phase aligner 730 is operatively coupled to receivers 723. Phase aligner 730 is operatively coupled to receivers 723 to provide receivers 723 with a timing reference signal CKA. Phase aligner 730 is also operatively coupled to sampler 720. Phase aligner 730 is operatively coupled to sampler 720 to provide sampler 720 with a timing reference signal CKB.

Timing reference port CK of source device 710 is operatively coupled to timing reference port CK port of destination device 729. Signal ports Q[1:P] of source device 710 are operatively coupled to ports Q[1:P] of destination device 729, respectively. Thus, sampler 720 and phase aligner 730 of destination device 729 receive timing reference signal CK from source device 710. Phase aligner 730 can buffer and/or generate internal clocks or strobes derived from the CK signal (via level converter 726) from source device 710. Phase aligner 730 can produce CKA and/or CKB from the CKLC7 signal received from level converter 726. Phase aligner 730 provides these timing references (which are derived from the CK signal via CKLC7) to receivers 723. Receivers 723 of destination device 729 receive the Q[1:P] signals from source device 710. Destination device 729 may also include drivers (not shown in FIG. 7) for driving signals to source device 710 either via the Q[1:P] signal ports or via separate ports. It should also be understood that although system 700 is illustrated as transmitting single-ended signals, the signals sent by source device 700 may represent one or more of pairs of differential signals. In another embodiment, a coding scheme might be used where N-bits of information are transmitted over M wires, where M is greater than or equal to N and the coding scheme presents advantages for physical implementation.

Source device 710 and destination device 729 may comprise circuitry on integrated circuit type devices, such as one commonly referred to as a "chip". Source device 710 and destination device 729 may be blocks of circuitry on the same integrated circuit. Source device 710 and destination device 729 may be parts or blocks of separate integrated circuit devices.

For example, source device 710 and/or destination device 729 may be part of a memory controller and/or a memory device. A memory controller, such as memory controller containing, for example, destination device 729, manages the flow of data going to and from memory devices (e.g. source device 710.) For example, a memory controller may be a northbridge chip, an application specific integrated circuit (ASIC) device, a graphics processor unit (GPU), a system-on-chip (SoC) or an integrated circuit device that includes many circuit blocks such as ones selected from graphics cores, processor cores, and MPEG encoder/decoders, etc. A memory device (e.g., source device 710) can include a dynamic random access memory (DRAM) core or other type of memory cores, for example, static random access memory (SRAM) cores, or non-volatile memory cores such as flash. In addition although the embodiments presented herein describe memory controller and components, the instant apparatus and methods may also apply to chip interfaces that effectuate signaling between separate integrated circuit devices.

It should be understood that signal ports Q[1:P] of both source device 710 and destination device 729 may correspond to any input or output ports of source device 710 or destination device 729 that rely on a timing reference signal communicated via one or more timing reference ports, such as CK, for synchronization. For example, signal ports Q[1: P] can correspond to bidirectional data ports used to communicate read and write data between source device 710 and destination device 729. The data ports may also be referred to as "DQ" pins. Thus, for a destination device 729 that reads and writes data up to 16 bits at a time, signal ports Q[1:P] can be seen as corresponding to ports DQ[0:15]. In another example, signal ports Q[1:P] can correspond to one or more unidirectional command/address (C/A) bus ports. Signal ports Q[1:P] can correspond to one or more unidirectional control ports. Thus, signal ports Q[1:P] on source device 710 and destination device 729 may correspond to ports such as CS (chip select), a command interface that includes timing control strobes such as RAS and CAS, address pins A[0:Y]

(i.e., address pins carrying address bits), DQ[0:X] (i.e., data ports carrying data bits), etc., and other signal conductor ports in past, present, or future devices.

CK is received by sampler 720 and phase aligner 730. Phase aligner 730 produces a first clock signal (CKA) and a second clock signal (CKB). CKA is supplied to receivers 723 as the timing reference signal that causes one or more of the Q[1:P] signals to be sampled. CKB is supplied to sampler 720 as the timing reference signal that causes CK to be sampled by sampler 720. The output of sampler 720 is the resolved value (PSIND) of CK as sampled by sampler 720 according to the timing of timing reference CKB. PSIND provides an indicator of, for each sampling of CK, the phase difference between CKB and CK.

PSIND and CK are received by phase aligner 730. Based on PSIND, phase aligner 730 adjusts the timing of CKB to align the transitions of CKB with the transitions of CK minus the setup time of the sampler 720. I.e., phase aligner 730 adjusts the phase of CKB in order to minimize the phase difference between CKB and CK minus the setup time of the sampler 720. The phase difference between CKB and CK is indicated by PSIND. Thus, phase aligner 730 adjusts the phase of CKB according to PSIND such that the phase difference indicated by PSIND is minimized.

Phase aligner 730 also produces CKA. CKA is supplied to receivers 723 as the timing reference signal that causes one or more of the Q[1:P] signals to be sampled by the corresponding receivers 723. CKA may be a phase adjusted version of CK and/or CKB. For example, CKA may be derived from CK such that CKA is ¼ of a cycle out of phase with CKB (and thereby ¼ of a cycle minus the setup time of the sampler with respect to CK when the phase difference between CK and CKB minus the setup time of the sampler is minimized).

As described herein, it should be understood that the feedback loop formed by sampler 720, PSIND, phase aligner 730, and CKB functions to filter out jitter in the reception of CK from source 710. Also, when receivers 723 and sampler 720 are matched (i.e., receivers 723 and sampler 720 have the same design and are supplied by the same power supplies) the jitter of sampler 720 will be correlated with the jitter of receivers 723. This helps make the timing of the sampling of the Q[1:P] signals according to the timing of CKA more accurate. In addition, sampler 720 may be selected and designed to be more immune to signal and/or power supply noise than a level converter. Additional elements, such as clock and/or data buffers (i.e., buffers in the signal path of CK, CKA and/or the Q[1:P] signals) may be included in the feedback loop. By including these buffers in the feedback loop, the loop will function to help cancel out jitter introduced by these buffers. Finally, it should be understood that the feedback loop may only be activated (i.e., actively adjusting the timing of CKB to minimize the phase difference with CK minus the setup time of the sampler) intermittently. A periodic or occasional calibration of CKB (and hence CKA) may be performed while the loop is activated and the loop disabled the rest of the time. These calibrations may be performed even at times when, for example, the Q[1:P] signals are carrying valid information. When these calibrations are performed while the Q[1:P] signals are valid, these calibrations can be performed without interrupting the data traffic carried by the Q[1:P] signals.

Figure 8:
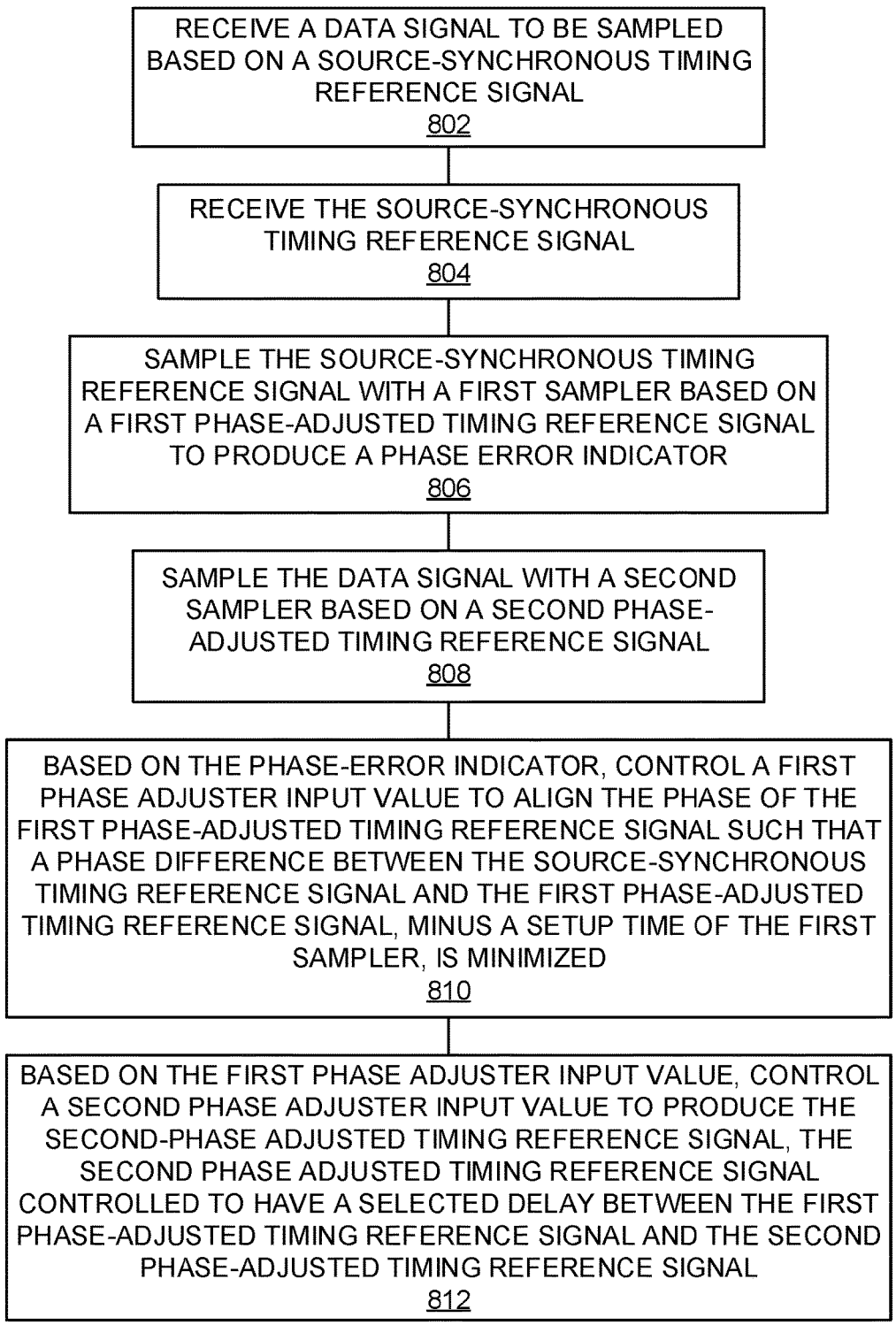
FIG. 8 is a flowchart illustrating a method of generating a data sampling timing reference signal.

FIG. 8 is a flowchart illustrating a method of generating a data sampling timing reference signal. The steps illustrated in FIG. 8 may be performed by one or more elements of receiver 100, receiver 200, receiver 300, receiver 400, receiver 500, and/or communication system 700. A data signal to be sampled based on a source-synchronous timing reference signal is received (802). For example, sampler 310 of receiver 300 may receive data signal DIN which is to be sampled based on the source-synchronous timing reference signal CKIN3. A source-synchronous timing reference signal is received (804). For example, sampler 320, CKA phase shifter 333, or CKB phase shifter 332 of receiver 300 may receive the source-synchronous timing reference signal CKIN3.

The source-synchronous timing reference signal is sampled with a first sampler based on a first phase-adjusted timing reference signal to produce a phase error indicator (806). For example, sampler 320 may produce a phase-error indicator signal PSIND3 by sampling the source-synchronous timing reference signal CKIN3 according the timing of CKB3, where CKB3 has been phase-adjusted from CKIN3 by CKB phase shifter 332. The data signal is sampled based on a second phase-adjusted timing reference signal (808). For example, the data signal DIN3 may be sampled by sampler 310 according to the timing of CKA3, where CKA3 has been phase-adjusted from CKIN3 by CKA phase shifter 333.

A first phase adjuster input value is controlled, based on the phase-error indicator, to align the phase of the first phase-adjusted timing reference signal such that a phase difference between the source-synchronous timing reference signal and the first phase adjusted timing reference signal minus a setup time of the first sampler is minimized (810). For example, the input value to CKB phase shifter 332 received from filter 331, which is based on the phase-error indicator PSIND3, is adjusted in order to minimize, over a period of time, the phase difference between CKB3 and CKIN3 minus the setup time of sampler 320.

A second phase adjuster input value is controlled, based on the first phase adjuster input value, to produce the second phase-adjusted timing reference signal. The second phase adjusted timing reference signal is controlled to have a selected delay between the first phase-adjusted timing reference signal and the second phase-adjusted timing reference signal (812). For example, the input value to CKA phase shifter 333 received from offset 334 can be controlled by offset 334, to create a selected delay or phase shift between CKB3 and CKA3.

Figure 9:
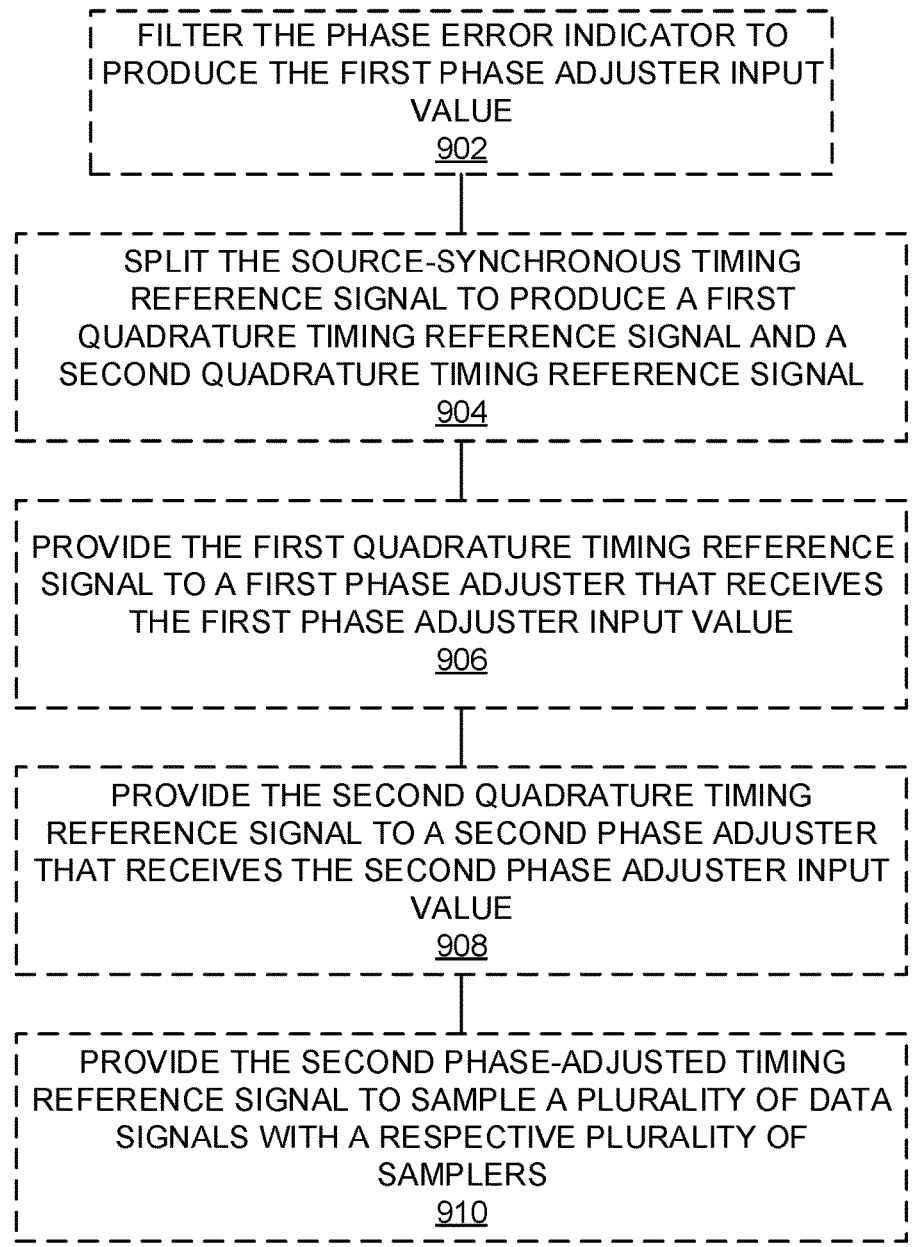
FIG. 9 is an illustration of steps that may be used in a method of generating a data sampling timing reference signal.

FIG. 9 is an illustration of steps that may be used in a method of generating a data sampling timing reference signal. The steps illustrated in FIG. 9 may optionally be performed by one or more elements of receiver 100, receiver 200, receiver 300, receiver 400, receiver 500, and/or communication system 700. A first phase error indicator may be filtered to produce the first phase adjuster input value (902). For example, PSIND4 of receiver 400 may be filtered by phase indicator filter 431 to produce an input value to B phase mixer 432. The source-synchronous timing reference signal may be split to produce a first quadrature timing reference signal and a second quadrature timing reference signal (904). For example, phase splitter 435 may produce in-phase and quadrature (I/Q) signals from the level converted (by level converter 426) CKIN4 signal.

The first quadrature timing reference signal may be provided to a first phase adjuster that receives the first phase adjuster input value (906). For example, the quadrature signal from phase splitter 435 may be provided to B phase mixer 432. The second quadrature timing reference signal may be provided to a second phase adjuster that receives a second phase adjuster input value (906). For example, the in-phase signal from phase splitter 435 may be provided to A phase mixer 433. Phase mixer 433 may receive a second phase adjuster input value that is modified from the first phase adjuster input value. Phase mixer 433 may receive a second phase adjuster input value that is the same as the first phase adjuster input value (i.e., an offset/delay of zero.) In an embodiment, this will be in a system where reference clock (e.g., CKIN4) is edge-to-center-aligned with respect to data (e.g., DIN4). In this embodiment, only one phase mixer (e.g., B phase mixer 432) will be required.

The second phase adjusted timing reference signal is provided to sample a plurality of data signals with a respective plurality of samplers (910). For example, a plurality of samplers 410 may receive CKA4 in order to sample a plurality of data signals similar to DIN.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of receiver 100, receiver 200, receiver 300, receiver 400, receiver 500, and/or communication system 700, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
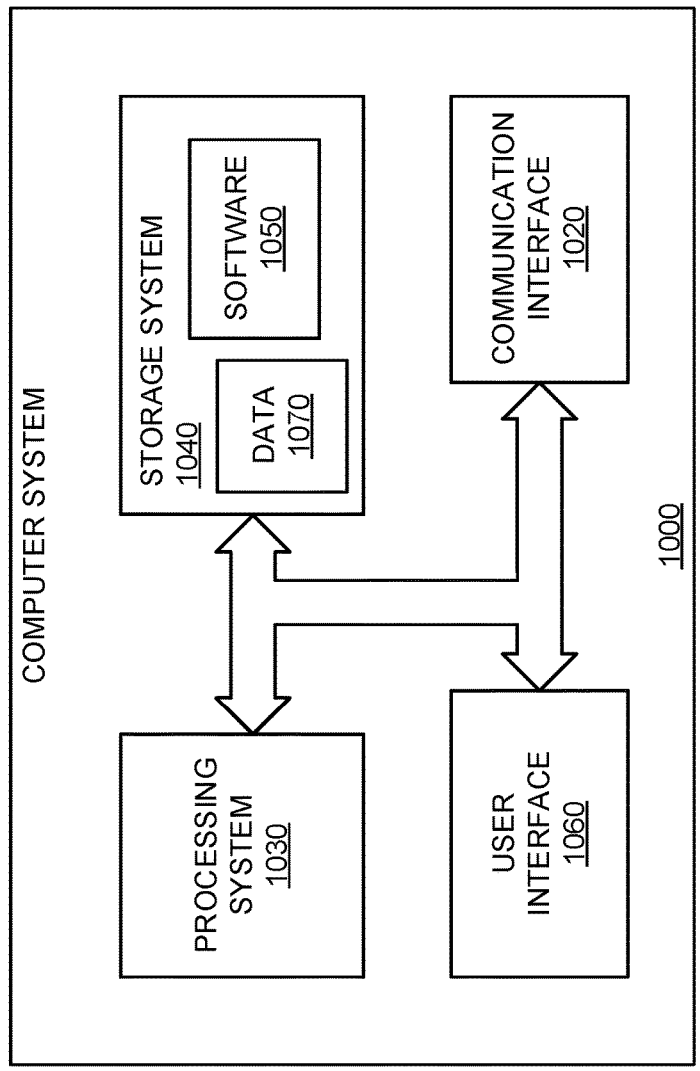
FIG. 10 is a block diagram of a computer system.

FIG. 10 illustrates a block diagram of a computer system. Computer system 1000 includes communication interface 1020, processing system 1030, storage system 1040, and user interface 1060. Processing system 1030 is operatively coupled to storage system 1040. Storage system 1040 stores software 1050 and data 1070. Processing system 1030 is operatively coupled to communication interface 1020 and user interface 1060. Computer system 1000 may comprise a programmed general-purpose computer. Computer system 1000 may include a microprocessor. Computer system 1000 may comprise programmable or special purpose circuitry. Computer system 1000 may be distributed among multiple devices, processors, storage, and/or interfaces that together comprise elements 1020-1070.

Communication interface 1020 may comprise a network interface, modem, port, bus, link, transceiver, or other communication device. Communication interface 1020 may be distributed among multiple communication devices. Processing system 1030 may comprise a microprocessor, microcontroller, logic circuit, or other processing device. Processing system 1030 may be distributed among multiple processing devices. User interface 1060 may comprise a keyboard, mouse, voice recognition interface, microphone and speakers, graphical display, touch screen, or other type of user interface device. User interface 1060 may be distributed among multiple interface devices. Storage system 1040 may comprise a disk, tape, integrated circuit, RAM, ROM, EEPROM, flash memory, network storage, server, or other memory function. Storage system 1040 may include computer readable medium. Storage system 1040 may be distributed among multiple memory devices.

Processing system 1030 retrieves and executes software 1050 from storage system 1040. Processing system 1030 may retrieve and store data 1070. Processing system 1030 may also retrieve and store data via communication interface 1020. Processing system 1050 may create or modify software 1050 or data 1070 to achieve a tangible result. Processing system may control communication interface 1020 or user interface 1060 to achieve a tangible result. Processing system 1030 may retrieve and execute remotely stored software via communication interface 1020.

Software 1050 and remotely stored software may comprise an operating system, utilities, drivers, networking software, and other software typically executed by a computer system. Software 1050 may comprise an application program, applet, firmware, or other form of machine-readable processing instructions typically executed by a computer system. When executed by processing system 1030, software 1050 or remotely stored software may direct computer system 1000 to operate as described herein.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A receiver circuit, comprising:
    a phase-alignment circuit to receive a phase indicator and a timing reference signal to produce, based on the phase indicator and the timing reference signal, a phase adjusted sampling timing reference signal and a phase adjusted feedback timing reference signal;
    a first sampler circuit to resolve a data signal in response to the sampling timing reference signal received from the phase-alignment circuit; and,
    a second sampler circuit to resolve the timing reference signal in response to the feedback timing reference signal and to output the phase indicator.

2. The receiver circuit of claim 1, wherein the sampling timing reference signal and the phase adjusted feedback timing reference signal have different phase adjustments.

3. The receiver circuit of claim 1, wherein the feedback timing reference signal is also used as the sampling timing reference signal.

4. The receiver circuit of claim 1, wherein, based on the phase indicator, the phase-alignment circuit is to adjust the feedback timing reference signal to minimize a phase error between the timing reference signal and the feedback timing reference signal.

5. The receiver circuit of claim 1, wherein the phase-alignment circuit comprises:
    a loop filter to receive the phase indicator and to control a first phase adjuster, the first phase adjuster producing the feedback timing reference signal.

6. The receiver circuit of claim 5, further comprising:
a second phase adjuster, the second phase adjuster to produce the sampling timing reference signal to have an approximately constant delay between the feedback timing reference signal and the sampling timing reference signal.

7. The receiver circuit of claim 5, wherein the first phase adjuster comprises a first digitally controlled phase mixer and the second phase adjuster comprises a second digitally controlled phase mixer, the first digitally controlled phase mixer receiving a first digital input value, the second digitally controlled phase mixer receiving a second digital input value that is a constant offset from the first digital input value.

8. A method of generating a data sampling timing reference, comprising:
receiving a data signal to be sampled based on a source-synchronous timing reference signal;
receiving the source-synchronous timing reference signal;
sampling the source-synchronous timing reference signal with a first sampler based on a first phase-adjusted timing reference signal to produce a phase error indicator;
sampling the data signal with a second sampler based on a second phase-adjusted timing reference signal;
based on the phase error indicator, controlling a first phase adjuster input value to align the phase of the first phase-adjusted timing reference signal such that a phase difference between the source-synchronous timing reference signal and the first phase-adjusted timing reference signal is minimized; and,
based on the phase adjuster input value, controlling a second phase adjuster input value to produce the second phase-adjusted timing reference signal, the second phase-adjusted timing reference signal controlled to have a selected delay between the source-synchronous timing reference signal and the second phase-adjusted timing reference signal.

9. The method of claim 8, wherein the second phase adjuster input value is a constant offset from the first phase adjuster input value.

10. The method of claim 8, wherein the design of the first sampler and the design of the second sampler are matched for approximately equal timing characteristics.

11. The method of claim 8, further comprising:
filtering the phase error indicator to produce the first phase adjuster input value.

12. The method of claim 8, further comprising:
splitting the source-synchronous timing reference signal to produce a first quadrature timing reference signal and a second quadrature timing reference signal;
providing the first quadrature timing reference signal to a first phase adjuster that receives the first phase adjuster input value; and,
providing the second quadrature timing reference signal to a second phase adjuster that receives the second phase adjuster input value.

13. The method of claim 12, further comprising:
providing the second phase-adjusted timing reference signal to sample a plurality of data signals with a respective plurality of samplers.

14. A timing reference receiver circuit for a source-synchronous data communication system, comprising:
a phase detector to receive a reference signal and a feedback signal; and,
a phase-alignment circuit to receive the reference signal and an output of the phase detector, the phase-alignment circuit to generate a phase adjusted signal based on the reference signal, the phase adjusted signal to be provided to a timing reference input of a data sampler circuit of the source-synchronous data communication system.

15. The timing reference receiver circuit of claim 14, wherein the phase detector comprises:
a timing reference sampler circuit to resolve the reference signal in response to a feedback timing reference signal and to output a phase indicator, the design of data sampler circuit and the design of the timing reference sampler circuit being matched for approximately equal timing characteristics.

16. The timing reference receiver of claim 14, wherein, based on the output of the phase detector, the phase-alignment circuit is to adjust the feedback signal to minimize a phase error between the reference signal and the feedback signal.

17. The timing reference receiver of claim 14, wherein a delay between the reference signal and the phase adjusted signal is based on the output of the phase detector.

18. The timing reference receiver of claim 14, wherein the phase-alignment circuit comprises:
a phase feedback path that adjusts a first digital input value to a first phase delay element to minimize a phase error between the reference signal and the feedback signal.

19. The timing reference receiver of claim 18, wherein a second phase delay element generates the phase adjusted signal, the second phase delay element receiving a second digital input value that is based on the first digital input value.

20. The timing reference receiver of claim 18, wherein the second digital input value is calculated from the first digital input value to produce a selected delay between the feedback signal and the phase adjusted signal.

* * * * *